United States Patent
Nguyen et al.

(10) Patent No.: US 12,212,227 B2
(45) Date of Patent: Jan. 28, 2025

(54) VARIABLE CURRENT GATE DRIVER AND SYSTEM

(71) Applicant: GM GLOBAL TECHNOLOGY OPERATIONS LLC, Detroit, MI (US)

(72) Inventors: Hong Nguyen, Rochester Hills, MI (US); Michael Z. Pieszala, Kathleen, GA (US); Yilun Luo, Ann Arbor, MI (US); Khorshed Mohammed Alam, Canton, MI (US); Sanjeev M. Naik, Troy, MI (US); Benjamin S. Ngu, Madison Heights, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 272 days.

(21) Appl. No.: 17/865,482

(22) Filed: Jul. 15, 2022

(65) Prior Publication Data

US 2024/0022161 A1    Jan. 18, 2024

(51) Int. Cl.
| | |
|---|---|
| *H02M 1/08* | (2006.01) |
| *H02M 1/00* | (2006.01) |
| *H02M 7/5395* | (2006.01) |
| *H03K 17/04* | (2006.01) |
| *H03K 17/16* | (2006.01) |
| *H02M 7/5387* | (2007.01) |
| *H03K 17/041* | (2006.01) |
| *H03K 17/042* | (2006.01) |

(52) U.S. Cl.
CPC ........... *H02M 1/08* (2013.01); *H02M 1/0029* (2021.05); *H02M 7/5395* (2013.01); *H03K 17/04* (2013.01); *H03K 17/16* (2013.01); *H03K 17/166* (2013.01); *H02M 7/5387* (2013.01); *H03K 17/041* (2013.01); *H03K 17/042* (2013.01); *H03K 17/04206* (2013.01)

(58) Field of Classification Search
CPC .... H02M 1/08; H02M 1/0029; H02M 7/5387; H03K 17/04; H03K 17/166; H03K 17/04206
See application file for complete search history.

(56) References Cited

U.S. PATENT DOCUMENTS

| | | | |
|---|---|---|---|
| 2016/0142048 A1* | 5/2016 | Zoels | H02M 1/08 327/109 |
| 2017/0012618 A1* | 1/2017 | Krishna | H03K 17/166 |
| 2017/0353128 A1* | 12/2017 | Ikeda | H02M 1/08 |
| 2018/0269869 A1* | 9/2018 | Mukhopadhyay | H02M 1/08 |
| 2021/0105013 A1* | 4/2021 | Sugie | H03K 17/04206 |

* cited by examiner

*Primary Examiner* — Adolf D Berhane
*Assistant Examiner* — Jye-June Lee
(74) *Attorney, Agent, or Firm* — Quinn IP Law

(57) ABSTRACT

A variable current gate driver for a transistor includes a first current control device having a first controllable output current. The first current control device is electrically connected between a first bus and an activator of the transistor, and a second current control device having a second controllable output current. The second current control device is electrically connected between the activator of the transistor and a second bus. A controller is operatively connected to the first and second current control devices to control the first and second controllable output currents to control the first and second current control devices to control activation of the transistor via the activator. The controller is operative to control the first and second current control devices to control a slew rate of the transistor.

19 Claims, 5 Drawing Sheets

VARIABLE CURRENT GATE DRIVER AND SYSTEM

INTRODUCTION

Systems, devices and methods for controlling transistors presently employ a gate driver, which uses a power source to charge and discharge a gate of the transistor to turn the transistor on and off, respectively, with a gate resistor arranged to control the gate current. Limitations associated with using a voltage source to drive a transistor gate may include that the voltage may be variable because the voltage may be susceptable to variation or a sudden decrease in response to a large current or load demand. Furthermore, there may be a non-linear capacitive load. Furthermore, the gate resistor permits only a single, fixed switching slew rate.

SUMMARY

The concepts described herein provide for a variable current gate driver for a semiconductor switch (hereafter "transistor") that employs a variable current source to charge and discharge a gate to activate and deactivate the transistor. The use of a variable current source enables direct control of the current on the low signal side. This arrangement reduces electrical power losses. This arrangement also enables use of a wide range of current and/or voltage slew rates at the gate of the transistor, which reduces or eliminates gate current dependence on gate path resistance and inductance, as compared with constant voltage source gate drivers. When a plurality of transistors are employed in an inverter to control a multi-phase electric machine, the use of variable slew rates may reduce inverter switching losses, improve efficiency, and provide other benefits in-use.

A method, apparatus, and control system for a variable current gate driver includes a variable current source to control activation and deactivation of a solid state switch such as a transistor, a power transistor, a semiconductor switch, a gate-controlled reversible diode, etc. (hereafter "transistor"). The variable current source facilitates the use of multiple variable slew rates for activating and/or deactivating the transistor to reduce switching losses. When the variable current gate driver including a variable current source is employed to control a plurality of transistors that make up a power inverter for driving an electric machine, it is able to reduce switching losses to improve motor efficiency.

An aspect of the disclosure may include a variable current gate driver for a transistor. The variable current gate driver has a first current control device having a first controllable output current, the first current control device being electrically connected between a first bus and an activator of the transistor, and a second current control device having a second controllable output current, the second current control device being electrically connected between the activator of the transistor and a second bus. A controller is operatively connected to the first and second current control devices to control the first and second controllable output currents to control the first and second current control devices to control activation of the transistor via the activator.

Another aspect of the disclosure may include the controller being operative to control the first and second current control devices to control a slew rate of the transistor.

Another aspect of the disclosure may include the controller being operative to control the first and second current control devices to control the slew rate of the transistor to a first slew rate during operation in a first state, and control the first and second current control devices to control the slew rate of the transistor to a second slew rate during operation in a second state.

Another aspect of the disclosure may include the first slew rate being greater than the second slew rate.

Another aspect of the disclosure may include the first slew rate being less than the second slew rate.

Another aspect of the disclosure may include the first slew rate being equivalent to the second slew rate.

Another aspect of the disclosure may include the controller being operative to control the first and second current control devices to control an OFF-to-ON slew rate of the transistor.

Another aspect of the disclosure may include the controller being operative to control the first and second current control devices to control an ON-to-OFF slew rate of the transistor.

Another aspect of the disclosure may include the first current control device being a variable current source, and the second current control device being a variable current source.

Another aspect of the disclosure may include the first current control device being a first modified voltage source having a controllable output current, and the second current control device being a second modified voltage source having a controllable output current.

Another aspect of the disclosure may include the transistor being one of a bipolar junction transistor (BJT), a thyristor, a high electron mobility transistor (HEMT), a field-effect transistor (FET), a metal oxide semiconductor field effect transistor (MOSFET), an integrated gate bipolar transistor (IGBT), or a gallium-nitride (GaN) transistor.

Another aspect of the disclosure may include the first bus having a positive voltage and the second bus having a negative voltage.

Another aspect of the disclosure may include the first bus having a positive voltage and the second bus having a reference voltage.

Another aspect of the disclosure may include the reference voltage being a ground.

Another aspect of the disclosure may include the first bus having a reference voltage and the second bus having a negative voltage.

Another aspect of the disclosure may include the controller being operative to control the first current control device independently from the second current control device to control activation of the transistor via the activator.

Another aspect of the disclosure may include a variable current gate driver for a transistor that may include a first current control device having a first controllable output current, the first current control device being electrically connected between a first bus and an activator of the transistor; and a second current control device having a second controllable output current, the second current control device being electrically connected between the activator of the transistor and a second bus.

Another aspect of the disclosure may include a power inverter including a plurality of power switches arranged between a positive bus and a negative bus, wherein each of the plurality of power switches may include an activator, and a variable current gate driver including a plurality of current-controlled gate drivers operatively coupled to the activators of the plurality of power switches. Each of the plurality of current-controlled gate drivers may include a first current control device having a first controllable output current that is electrically connected between the activator of the respective power switch and the positive bus, and a second current control device having a second controllable output current that is electrically connected between the activator of the power switch and the negative bus. A controller is operatively connected to the first current control device and the second current control device of each of the plurality of current-controlled gate drivers. The controller is operative to control the first current control device and second current control device to activate the plurality of power switches via the plurality of current-controlled gate drivers.

Another aspect of the disclosure may include the controller being operative to control the first and second variable current sources to activate the plurality of power switches via the plurality of gate drivers to control slew rates of the plurality of power switches.

Another aspect of the disclosure may include the controller operative to control the first and second variable current sources to control the slew rates of the plurality of power switches comprises the controller by controlling the first and second variable current sources to control the plurality of power switches to a first slew rate when transitioning the plurality of power switches from a first state to a second state, and controlling the first and second variable current sources to control the plurality of power switches to a second slew rate during operation in a second state, wherein the first slew rate is greater than the second slew rate.

The above summary is not intended to represent every possible embodiment or every aspect of the present disclosure. Rather, the foregoing summary is intended to exemplify some of the novel aspects and features disclosed herein. The above features and advantages, and other features and advantages of the present disclosure, will be readily apparent from the following detailed description of representative embodiments and modes for carrying out the present disclosure when taken in connection with the accompanying drawings and the claims.

BRIEF DESCRIPTION OF THE DRAWINGS

One or more embodiments will now be described, by way of example, with reference to the accompanying drawings, in which.

Figure 1:
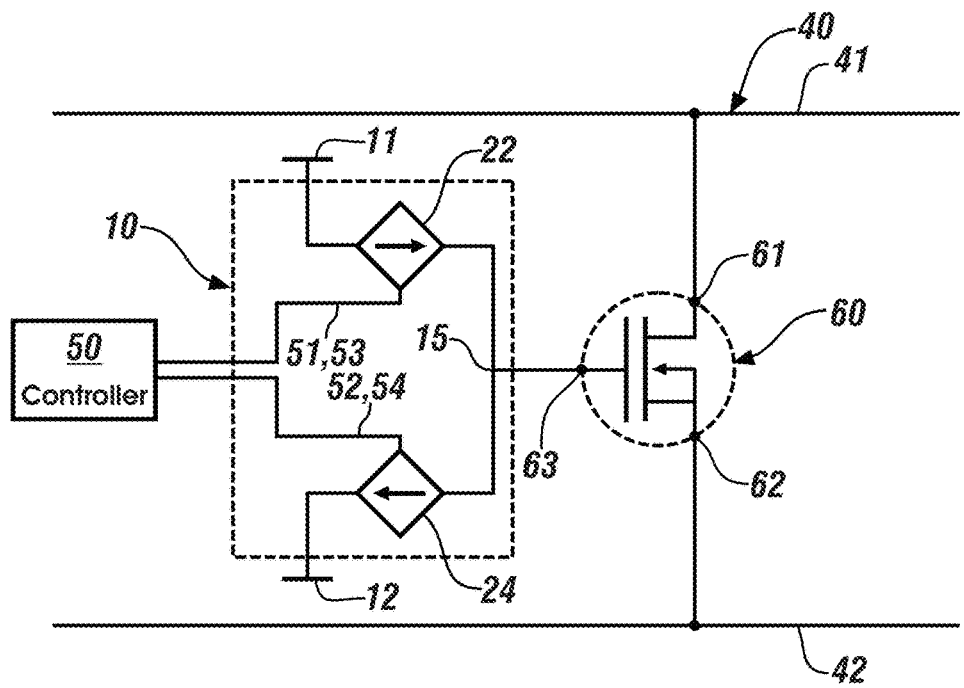
FIG. 1 schematically illustrates a variable current gate driver that is electrically operatively connected to a transistor, in accordance with the disclosure.

The appended drawings are not necessarily to scale, and may present a somewhat simplified representation of various preferred features of the present disclosure as disclosed herein, including, for example, specific dimensions, orientations, locations, and shapes. Details associated with such features will be determined in part by the particular intended application and use environment.

DETAILED DESCRIPTION

The components of the disclosed embodiments, as described and illustrated herein, may be arranged and designed in a variety of different configurations. Thus, the following detailed description is not intended to limit the scope of the disclosure, as claimed, but is merely representative of possible embodiments thereof. In addition, while numerous specific details are set forth in the following description in order to provide a thorough understanding of the embodiments disclosed herein, some embodiments can be practiced without some of these details. Moreover, for the purpose of clarity, certain technical material that is understood in the related art has not been described in detail in order to avoid unnecessarily obscuring the disclosure.

Furthermore, the drawings are in simplified form and are not to precise scale. For purposes of convenience and clarity only, directional terms such as top, bottom, left, right, up, over, above, below, beneath, rear, and front, may be used with respect to the drawings. These and similar directional terms are not to be construed to limit the scope of the disclosure. Furthermore, the disclosure, as illustrated and described herein, may be practiced in the absence of an element that is not specifically disclosed herein. Throughout the drawings, corresponding reference numerals indicate like or corresponding parts and features.

As used herein, the term "system" may refer to one of or a combination of mechanical and electrical actuators, sensors, controllers, application-specific integrated circuits (ASIC), combinatorial logic circuits, software, firmware, and/or other components that are arranged to provide the described functionality.

Embodiments may be described herein in terms of functional and/or logical block components and various processing steps. Such block components may be realized by a combination or collection of mechanical and electrical hardware, software, and/or firmware components configured to perform the specified functions. For example, an embodiment may employ various combinations of mechanical components and electrical components, integrated circuit components, memory elements in the form of control algorithms and calibrations, digital signal processing elements, logic elements, look-up tables, or the like, which may carry out a variety of functions under the control of one or more microprocessors or other control devices. In addition, those skilled in the art will appreciate that the embodiments may be practiced in conjunction with other mechanical and/or electronic systems, and that the vehicle systems described herein are merely embodiments of possible implementations.

The use of ordinals such as first, second and third does not necessarily imply a ranked sense of order, but rather may only distinguish between multiple instances of an act or structure.

Referring to the drawings, wherein like reference numerals correspond to like or similar components throughout the several Figures, FIG. 1, consistent with embodiments disclosed herein, illustrates a non-limiting example of a variable current gate driver 10 for a solid state switch (transistor) 60. The transistor 60 is a semiconductor switch e.g., a power transistor, in one embodiment. The transistor 60 may be one of a field-effect transistor (FET), a metal oxide semiconductor field-effect transistor (MOSFET), an integrated gate bipolar transistor (IGBT), a gallium-nitride (GaN) transistor, a thyristor, a thermopile, a bipolar junction transistor (BJT), a thyristor, a high electron mobility transistor (HEMT), etc., without limitation.

The transistor 60 has a first power input 61, a second power input 62, and an activator 63. By way of example, when the transistor 60 is an IGBT, the first power input 61 is referred to as a collector, the second power input 62 is referred to as an emitter, and the activator 63 is referred to as a gate. By way of example, when the transistor 60 is a FET or MOSFET, the first power input 61 is referred to as a drain, the second power input 62 is referred to as a source, and the activator 63 is referred to as a gate.

The first and second power inputs 61, 62 are electrically connected to a power bus 40 that includes a positive bus or rail 41 and a negative bus or rail 42, with the first power input 61 electrically connected to the positive bus 41 and the second power input 62 electrically connected to the negative bus 42.

The activator 63 electrically connects to the variable current gate driver 10, which controls the activator 63 to control flow of electric power between the first power input 61 and the second power input 62.

The variable current gate driver 10 includes a first current control device 22 that is connected in series with a second current control device 24 at a junction 15, wherein the junction 15 is electrically connected to the activator 63.

Operations of the first and second current control devices 22, 24 are controlled by a controller 50. In one embodiment, the controller 50 is a gate driver integrated circuit or another circuit that is arranged to control the gate driver.

Electric power is input to the first current control device 22 via a first power input 11. In one embodiment, the first power input 11 is electrically connected to the positive bus 41. Alternatively, the first power input 11 is electrically connected to a reference voltage. Alternatively, the first power input 11 is electrically connected to a second power supply (not shown), with the second power supply being electrically isolated from the positive bus 41.

Electric power is input to the second current control device 24 via a second power input 12. In one embodiment, the second power input 12 is electrically connected to the negative bus 42. Alternatively, the second power input 12 is electrically connected to a reference voltage, or alternatively, to a ground. Alternatively, the second power input 12 is electrically connected to the second power supply (not shown), with the second power supply being electrically isolated from the negative bus 42.

As such, in one embodiment, the first power input 11 is electrically connected to the positive bus 41 and the second power input 12 is electrically connected to the negative bus 42.

Alternatively, the first power input 11 is electrically connected to the positive bus 41 and the second power input 12 is electrically connected to a reference voltage.

Alternatively, the first power input 11 is electrically connected to the positive bus 41 and the second power input 12 is electrically connected to ground.

Alternatively, the first power input 11 is electrically connected to a reference voltage and the second power input 12 is electrically connected to the negative bus 42. Alternatively, the first power input 11 is electrically connected to a reference voltage and the second power input 12 is electrically connected to ground.

The first current control device 22 is a variable current source, in one embodiment. Alternatively, the first current control device 22 is a modified voltage source having a controllable output current.

The second current control device 24 is a variable current source, in one embodiment. Alternatively, the second current control device 24 is a modified voltage source having a controllable output current.

The controller 50 generates a first control signal 51 and slew rate command 53 that are communicated to the first current control device 22 to effect control thereof, and generates a second control signal 52 and slew rate command 54 that are communicated to the second current control device 24 to effect control thereof.

The controller 50 controls the variable current gate driver 10 to control the first and second current control devices 22, 24 to control a first slew rate of the transistor 60 during an activation-to-deactivation (i.e., ON-OFF) transition. Stated differently, the variable current gate driver 10 controls the first and second current control devices 22, 24 to control a first slew rate of the transistor 60 during a transition in the form of a change of state from an ON state to an OFF state.

The controller 50 controls the variable current gate driver 10 to control the first and second current control devices 22, 24 to control a first slew rate of the transistor 60 during an activation-to-deactivation (i.e., ON-OFF) transition. Stated differently, the variable current gate driver 10 controls the first and second current control devices 22, 24 to control a first slew rate of the transistor 60 during a transition in the form of a change of state from an ON state to an OFF state. The controller 50 controls the variable current gate driver 10 to control the first and second current control devices 22, 24 to control a second slew rate of the transistor 60 during a deactivation-to-activation (i.e., OFF-ON) transition. Stated differently, the variable current gate driver 10 controls the first and second current control devices 22, 24 to control the second slew rate of the transistor 60 during a transition in the form of a change of state from an OFF state to an ON state. The concepts described herein may be used with transistors that operate at zero-voltage switching, including hard switched power electronic systems, and power inverters for electric vehicle (EV) and non-EV applications.

The controller 50 is operative to control the first current control device 22 independently from the second current control device 24 to control activation of the transistor 60 via the activator 63 to control the first and second slew rates.

In one embodiment, and/or under certain operating conditions, the first slew rate is greater than the second slew rate during the activation-to-deactivation (i.e., ON-OFF) transition.

In one embodiment, and/or under certain operating conditions, the first slew rate is less than the second slew rate during the activation-to-deactivation (i.e., ON-OFF) transition.

In one embodiment, and/or under certain operating conditions, the first slew rate is equivalent to the second slew rate during the activation-to-deactivation (i.e., ON-OFF) transition.

In one embodiment, and/or under certain operating conditions, the first slew rate is greater than the second slew rate during the deactivation-to-activation (i.e., OFF-ON) transition.

In one embodiment, and/or under certain operating conditions, the first slew rate is less than the second slew rate during the deactivation-to-activation (i.e., OFF-ON) transition.

In one embodiment, and/or under certain operating conditions, the first slew rate is equivalent to the second slew rate during the deactivation-to-activation (i.e., OFF-ON) transition.

Figure 2:
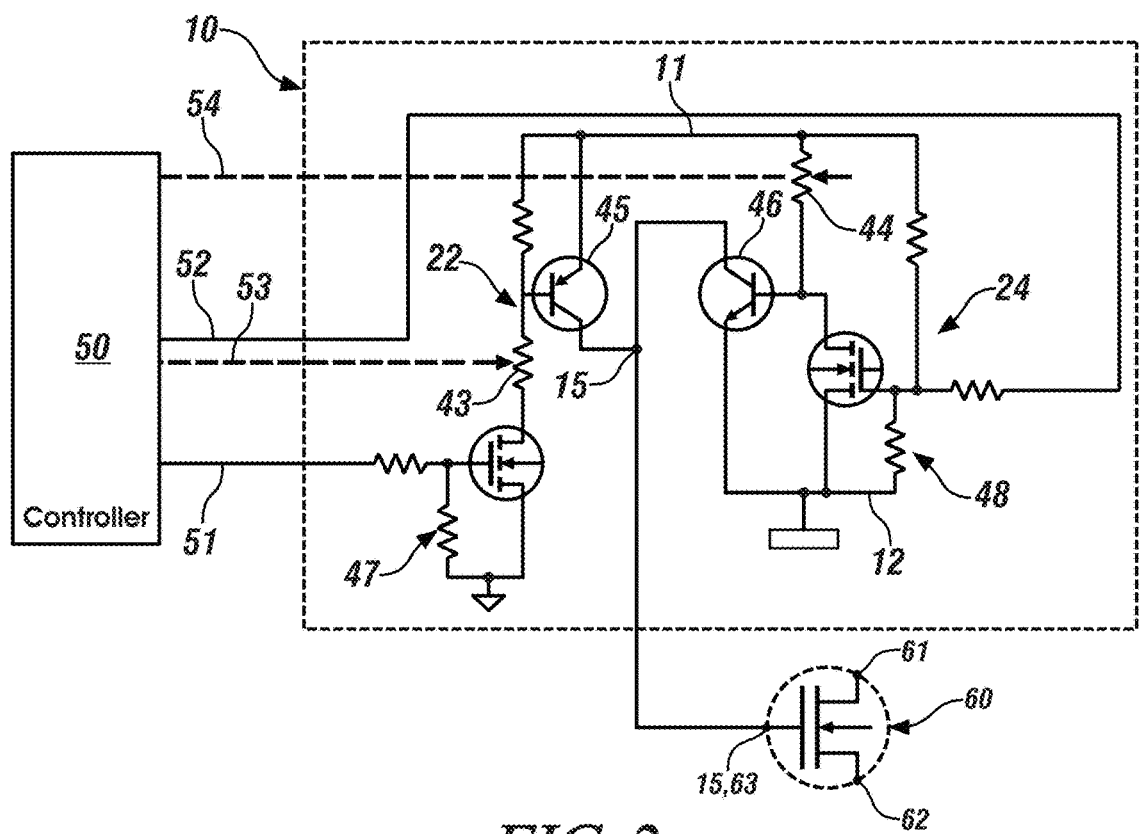
FIG. 2 schematically illustrates details of an embodiment of a variable current gate driver for a transistor that includes a first current control device having a first controllable output current and a second current control device having a second controllable output current, in accordance with the disclosure.

FIG. 2 schematically illustrates, with continued reference to elements that are described with reference to FIG. 1, a non-limiting embodiment of the variable current gate driver 10. The variable current gate driver 10 is in communication with and controlled by controller 50 and is operatively connected to activator 63 of transistor 60 at junction 15. The transistor 60 may be one of a field-effect transistor (FET), a metal oxide semiconductor field-effect transistor (MOSFET), an integrated gate bipolar transistor (IGBT), a gallium-nitride (GaN) transistor, a thyristor, a thermopile, etc., without limitation. As shown, the transistor 60 is a FET or MOSFET, the first power input 61 is referred to as a drain, the second power input 62 is referred to as a source, and the activator 63 is referred to as a gate.

The controller 50 is a gate driver circuit that is in communication with the variable current gate driver 10. The controller 50 generates a plurality of control signals, including a first control signal 51, a second control signal 52, a first resistor control signal (or slew rate) 53, and a second resistor control signal (or slew rate) 54, which are communicated to the variable current gate driver 10.

The variable current gate driver 10 includes first and second bi-polar junction transistors (BJTs) 45, 46, respectively, first and second variable resistors 43, 44, respectively, and first and second switch control circuits 47, 48, respectively, which are arranged between the first power input 11 and the second power input 12. The first and second BJTs 45, 46 are arranged in series, and form the junction 15. The first switch control circuit 47 is arranged in series with the first variable resistor 43, which connects to a gate of the first BJT 45. The second switch control circuit 48 is arranged in series with the second variable resistor 44, which connects to a gate of the second BJT 46.

The first control signal 51 is a first command signal that is input to the first switch control circuit 47. The first resistor control signal 53 is input to and controls the first variable resistor 43. The first control signal 51 and the first resistor control signal 53 control the activation, deactivation, and slew rates of the first BJT 45.

The second control signal 52 is a second command signal that is input to the second switch control circuit 48. The second resistor control signal 54 is input to and controls the second variable resistor 44. The second control signal 52 and the second resistor control signal 54 control the activation, deactivation, and slew rates of the second BJT 46.

The first and second variable resistors 43, 44 are employed to control the gate current, and thus control the slew rates. In one embodiment, the slew rates include an OFF-to-ON slew rate that is controlled by the first variable resistor 43, and an ON-to-OFF slew rate that is controlled by the second variable resistor 44.

In an alternative embodiment, a selectable resistor array composed as a set of selectable resistors of varying resistance may be employed in place of the first and second variable resistors 43, 44 to control the gate current, and thus control the ON-to-OFF slew rate and the OFF-to-ON slew rate.

This arrangement of the variable current gate driver 10 and controller 50 enables variable current control and current amplification, which enables improved control of gate slew rates. The first and second BJTs 45, 46 may be controlled by the first and second variable resistors 43, 44 to output different currents to the gate thus enabling operation over a range of discretely selected slew rates. An embodiment of the variable current gate driver 10 may be implemented in practice as an application-specific integrated circuit (ASIC).

Figure 3:
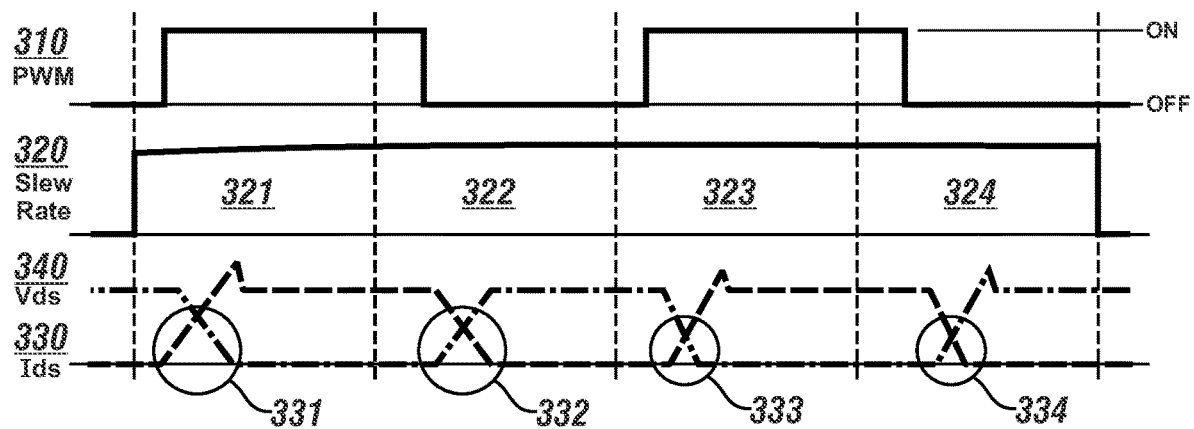
FIG. 3 graphically shows a control signal associated with operating an embodiment of a variable current gate driver to control an activator of a transistor, in accordance with the disclosure.

FIG. 3 graphically shows a pulsewidth-modulated (PWM) control signal 310, a slew rate control signal 320, and corresponding current signals 330 and voltage signals 340 that are associated with operating an embodiment of the variable current gate driver 10 that is described with reference to FIGS. 1 and 2 to control activator 63 of transistor 60.

The PWM control signal 310 is controlled to either an OFF state (OFF), or an ON state (ON). The slew rate is defined as the rate of change during the OFF-to-ON transition, or OFF-to-ON slew rate, or the rate of change during the ON-to-OFF transition, or the ON-to-OFF slew rate. The slew rate control signal 320 includes a slow OFF-to-ON slew rate 321, a slow ON-to-OFF slew rate 322, a fast OFF-to-ON slew rate 323, and a fast ON-to-OFF slew rate 324. The terms "slow" and "fast" are relative to each other, and represent discrete slew rates that may be selected based upon operating conditions such as voltage, current, temperature, etc.

Changes in the current signals 330 and voltage signals 340 corresponding to the changes in the slow OFF-to-ON slew rate 321, the slow ON-to-OFF slew rate 322, the fast OFF-to-ON slew rate 323, and the fast ON-to-OFF slew rate 324 are indicated. These lines graphically depict the effect of the various slew rates on the respective changes in the current signal 330 and voltage signal 340. Current-voltage overlap regions 331, 332, 333, and 334 are identified and indicate areas where power losses occur. Overlap regions 331 and 332 are associated with the slow OFF-to-ON slew rate 321 and the slow ON-to-OFF slew rate 322, and overlap regions 333 and 334 are associated with the fast OFF-to-ON slew rate 323 and the fast ON-to-OFF slew rate 324. The overlap regions 333 and 334 have less area than the overlap regions 331 and 332, indicating that there is less power loss with the fast OFF-to-ON slew rate 323 and the fast ON-to-OFF slew rate 324. However, there is less likelihood of ringing and overshoot with the overlap regions 331 and 332 that are associated with the slow OFF-to-ON slew rate 321 and the slow ON-to-OFF slew rate 322. Higher slew rates result in smaller overlap of current and voltage leading to less switching loss but higher overshoot and ringing in voltage and current, which may lead to increased risk of exceeding current and/or voltage limits or electro-magnetic interference issues. Slower slew rates result in greater overlap of current and voltage leading to greater switching loss but less overshoot and ringing in voltage and current leading to risk of less efficient operation. Each of the OFF-to-ON slew rate 321, the slow ON-to-OFF slew rate 322, the fast OFF-to-ON slew rate 323, and the fast ON-to-OFF slew rate 324 may be changed between cycles and within individual cycles.

Figure 4:
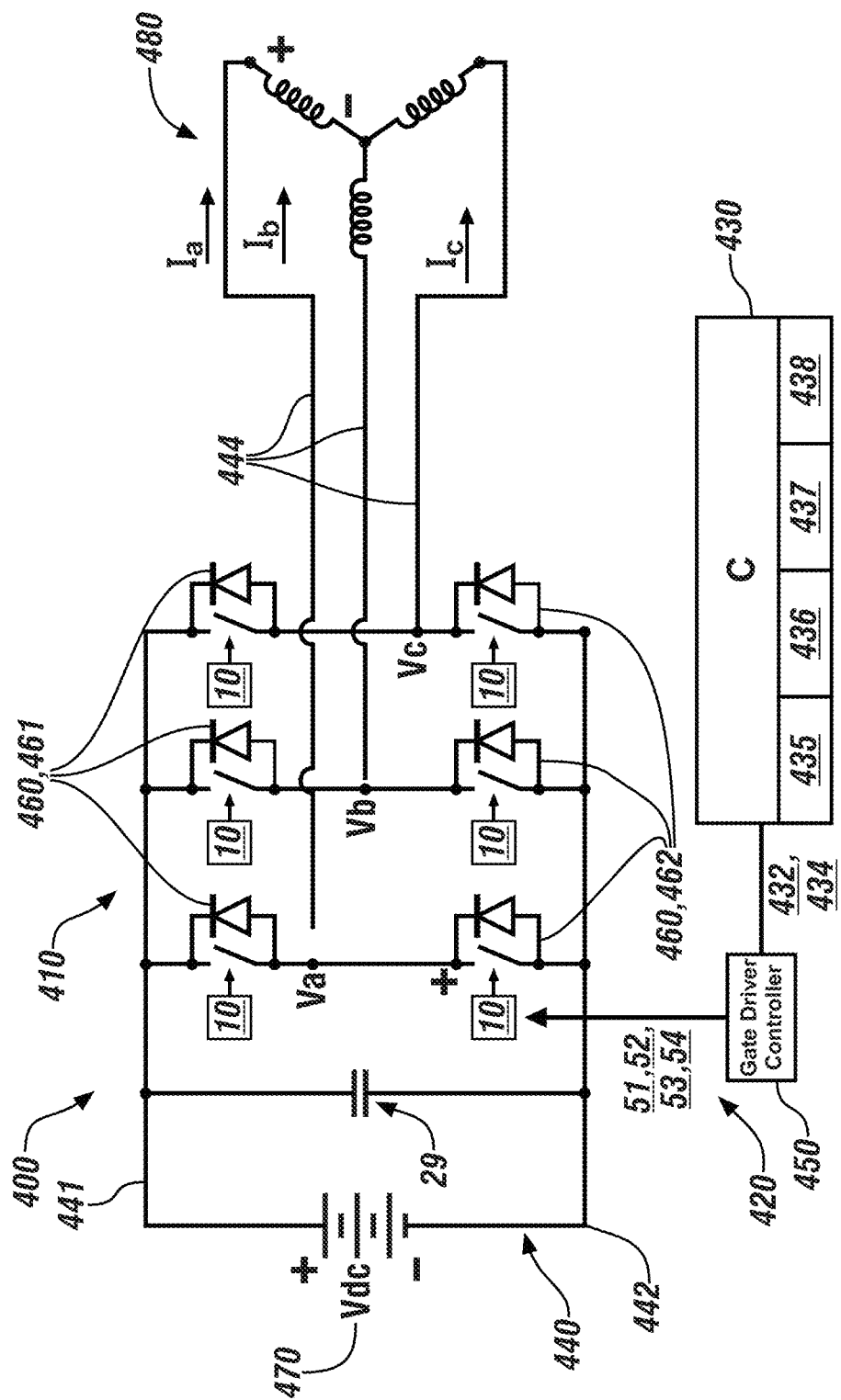
FIG. 4 schematically illustrates an inverter, control system, and multi-phase electric machine that employs an embodiment of the variable current gate driver described with reference to FIG. 1, in accordance with the disclosure.

FIG. 4 schematically illustrates an embodiment of a multi-phase motor drive system 400 that includes a rechargeable energy storage system (RESS) 470 that provides electric power to a multi-phase electric machine 480 via an inverter system 410. The inverter system 410 is controlled by an inverter controller 430 via a gate driver controller 450 and a variable current gate driver 420. The RESS 470 is a rechargeable device, e.g., a multi-cell lithium ion or nickel metal hydride battery.

The inverter system 410 electrically connects to the RESS 470 via a high-voltage bus 440 that has a positive DC voltage rail 441 and a negative DC voltage rail 442. The inverter system 410 electrically connects to the multi-phase electric machine 480 via a plurality of phase leads 444.

The inverter controller 430 is operatively connected to the inverter system 410 via the gate driver controller 450 and the variable current gate driver 420. The variable current gate driver 420 is composed of a plurality of the variable current gate drivers 10 that are described with reference to FIG. 1. In one embodiment, the variable current gate driver 420 acts alone and the gate driver controller 450 is omitted.

In one embodiment, the multi-phase electric machine 480 is arranged to provide propulsion torque in a vehicle. The vehicle may include, but not be limited to a mobile platform in the form of a commercial vehicle, industrial vehicle, agricultural vehicle, passenger vehicle, aircraft, watercraft, train, all-terrain vehicle, personal movement apparatus, robot and the like to accomplish the purposes of this disclosure.

The inverter system 410 includes a plurality of transistors 460 that are controlled by the inverter controller 430 via the variable current gate driver 420 that employs embodiments of the variable current gate driver 10 described with reference to FIG. 1. The plurality of transistors 460 are analogous to embodiments of the transistors 60 that are described with reference to FIG. 1. The plurality of transistors 460 are arranged as complementary-paired devices that are electrically connected in series between the positive bus 441 and the negative bus 442, with each of the paired transistors 460 being associated with one of the phases of the electric machine 480. In one embodiment, the plurality of transistors 460 are arranged as upper transistors 461 and lower transistors 462. In one embodiment, the plurality of transistors 460, i.e., the upper transistor 461 and the lower transistors 462, are all the same type of transistor, e.g., each of the transistors 460 is an IGBT device, or each of the transistors 460 is a FET, a MOSFET, or another type of transistor. In one embodiment, the upper transistors 461 are one type of transistor, e.g., an IGBT device, and lower transistors 462 are a second type of transistor, e.g., a FET, a MOSFET, or another type of transistor other than an IGBT device.

The plurality of variable current gate drivers 10 individually connect to one of the paired transistors 460 of one of the phases of the electric machine 480 to control operation thereof. Thus, the plurality of variable current gate drivers 10 are arranged as three pairs or a total of six variable current gate drivers 10 when the electric machine 480 is a three-phase device. The plurality of variable current gate drivers 10 receive operating commands from the inverter controller 430 directly or via the gate driver controller 450 to control activation and deactivation of each of the variable current gate drivers 10 to provide motor drive functionality of the electric machine 480 that is responsive to the operating commands. During operation, each variable current gate driver 10 generates a pulsewidth-modulated signal in response to a control signal originating from the inverter controller 430, which activates one of the transistors 460 and permits current flow through a half-phase of the inverter system 410.

The inverter system 410 is configured to transform high-voltage DC electric power to high-voltage AC electric power and transform high-voltage AC electric power to high-voltage DC electric power in response to commands from the inverter controller 430 via the variable current gate driver 420. The inverter system 410 may employ pulsewidth-modulating (PWM) control of the transistors 460 to convert stored DC electric power originating in the battery 470 to AC electric power to drive the electric machine 480 to generate torque. Similarly, the inverter system 410 converts mechanical power transferred to the electric machine 480 to DC electric power to generate electric energy that is storable in the battery 470, including as part of a regenerative braking control strategy when employed on-vehicle. The inverter system 410 receives motor control commands from the inverter controller 430 and controls inverter states to provide the motor drive and regenerative braking functionality.

The inverter controller 430 includes a processor (P) 436 and tangible, non-transitory memory (M) 437 on which is recorded instructions embodying a slew-rate selection and control strategy 435. The inverter controller 430 may also include an analog-to-digital converter (ADC) 438. The ADC 438 may be embodied as an electrical circuit providing a specific sampling rate which provides quantization of the continuous/analog voltage input and outputs a representative digital signal. The memory 437 may include read-only memory (ROM), flash memory, optical memory, additional magnetic memory, etc., as well as random access memory (RAM), electrically-programmable read only memory (EPROM), a high-speed clock, analog-to-digital (A/D) and/or digital-to-analog (D/A) circuitry, input/output circuitry or devices, and signal conditioning and buffer circuitry.

The inverter controller 430 generates control signals, include, e.g., a PWM control signal 432 and a slew rate control signal 434, which are communicated to the gate driver controller 450.

The gate driver controller 450 generates a set of signals, including, e.g., first control signal 51, second control signal 52, first resistor control signal (or slew rate) 53, and second resistor control signal (or slew rate) 54, for each of the variable current gate drivers 10 of the variable current gate driver 420 based upon the PWM control signal 432 and the slew rate control signal 434. These signals provide switching control and slew rate control of the input voltage to control the plurality of switches 460 of the inverter system 410 to power the multi-phase electric machine 480.

The term "controller" and related terms such as microcontroller, control, control unit, processor, etc. refer to one or various combinations of Application Specific Integrated Circuit(s) (ASIC), Field-Programmable Gate Array(s) (FPGA), Complex programmable logic devices (CPLD) electronic circuit(s), central processing unit(s), e.g., microprocessor(s) and associated non-transitory memory component(s) in the form of memory and storage devices (read only, programmable read only, random access, hard drive, etc.). The non-transitory memory component is capable of storing machine readable instructions in the form of one or more software or firmware programs or routines, combinational logic circuit(s), input/output circuit(s) and devices, signal conditioning, buffer circuitry and other components, which can be accessed by and executed by one or more processors to provide a described functionality. Input/output circuit(s) and devices include analog/digital converters and related devices that monitor inputs from sensors, with such inputs monitored at a preset sampling frequency or in response to a triggering event. Software, firmware, programs, instructions, control routines, code, algorithms, and similar terms mean controller-executable instruction sets including calibrations and look-up tables. Each controller executes control routine(s) to provide desired functions. Routines may be executed at regular intervals, for example every 100 microseconds during ongoing operation. Alternatively, routines may be executed in response to occurrence of a triggering event. Communication between controllers, actuators and/or sensors may be accomplished using a direct wired point-to-point link, a networked communication bus link, a wireless link, or another communication link. Communication includes exchanging data signals, including, for example, electrical signals via a conductive medium; electromagnetic signals via air; optical signals via optical waveguides; etc. The data signals may include discrete, analog and/or digitized analog signals representing inputs from sensors, actuator commands, and communication between controllers. The term "signal" refers to a physically discernible indicator that conveys information, and may be a suitable waveform (e.g., electrical, optical, magnetic, mechanical or electromagnetic), such as DC, AC, sinusoidal-wave, triangular-wave, square-wave, vibration, and similar signals that are capable of traveling through a medium.

A parameter is defined as a measurable quantity that represents a physical property of a device or other element that is discernible using one or more sensors and/or a physical model. A parameter can have a discrete value, e.g., either "1" or "0", or can be infinitely variable in value.

This arrangement provides an architecture that enables dynamic control of a variable gate turn-on slew rate and turn-off slew rate at every switching event to optimize system efficiency while ensuring operation of the transistors and other power devices.

Figure 5:
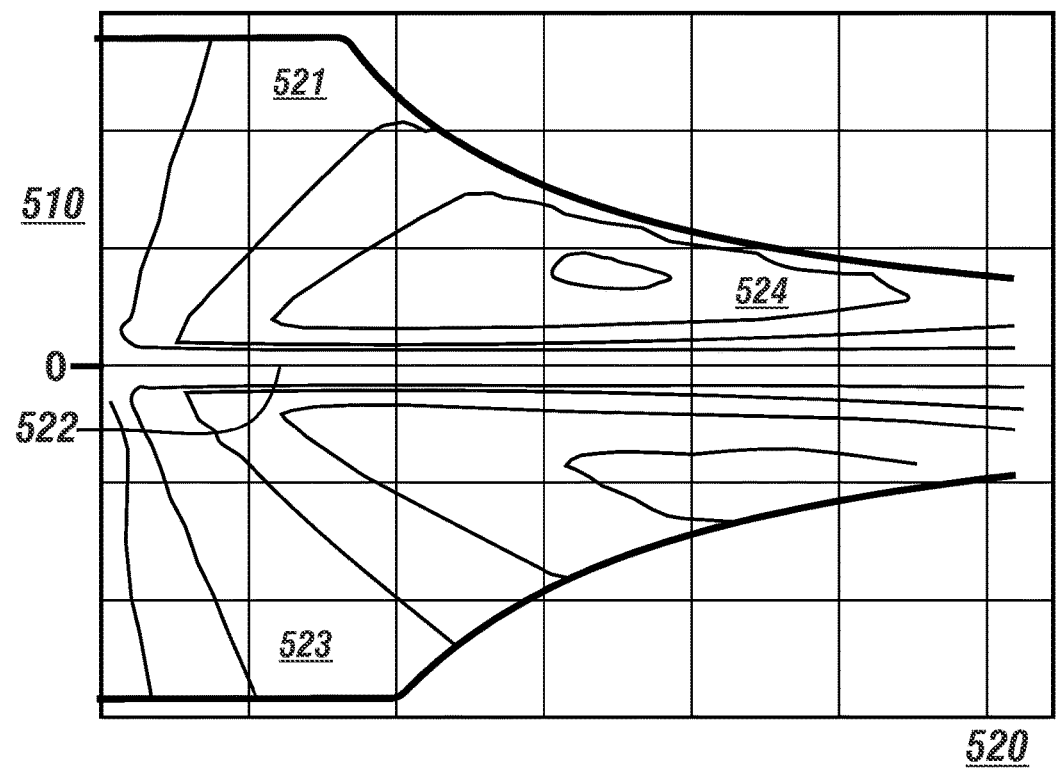
FIG. 5 graphically illustrates speed/torque operating regions and associated slew rates for operating an embodiment of the multi-phase motor drive system and variable current gate driver described herein, in accordance with the disclosure.

FIG. 5 graphically illustrates speed/torque operating regions and associated slew rates for operating an embodiment of the multi-phase motor drive system 400 that is described with reference to FIG. 4. Torque 510 is indicated on the vertical axis, and speed 520 is indicated on the horizontal axis. Operating regions include a high torque region 521, normal driving region 522, regenerative braking region 523, high-speed region 524, and high temperature region 525.

Operating the multi-phase motor drive system 400 includes controlling the plurality of variable current gate drivers 10 of the variable current gate driver 420 employing a variable, controllable gate turn-on slew rate and a variable, controllable gate turn-off slew rate at every switching event to optimize system efficiency, reduce power losses, reduce overvoltage events or undercurrent events, avoid switching speeds that may otherwise lead to electro-magnetic interference, avoid change rates of voltage and/or current that may otherwise cause mechanical stresses in the electric machine, among other factors.

Figure 6:
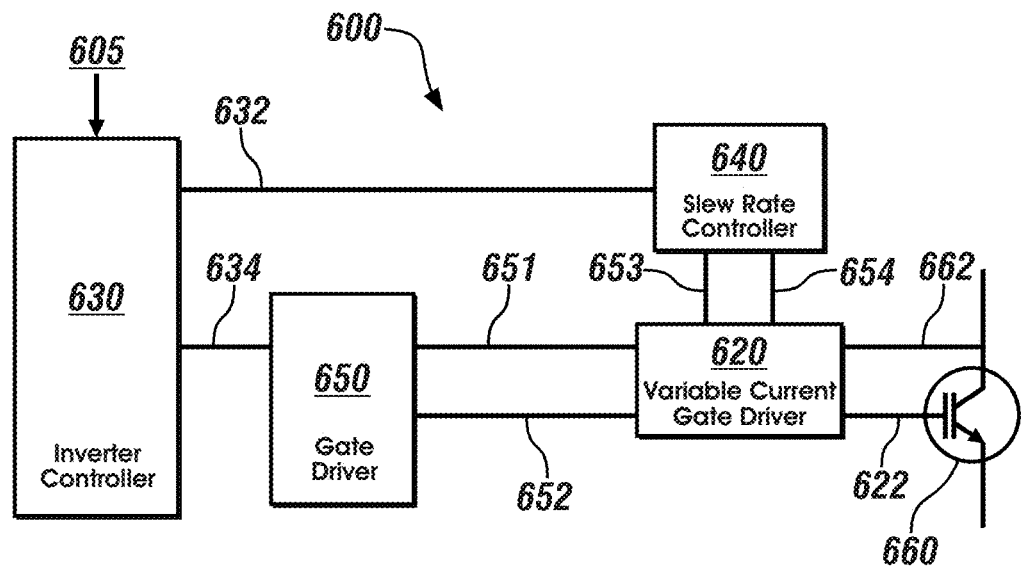
FIG. 6 schematically illustrates an embodiment of a variable current gate driver to control a transistor, in accordance with the disclosure.

FIG. 6 schematically illustrates an embodiment of a variable current gate driver 600 that incorporates an embodiment of a variable current gate driver 620 to control transistor 660, including controlling on and off slew rates of the transistor 660. In one embodiment, the transistor 660 is an element of an inverter for driving an electric machine, but the concepts described herein are not so limited.

The variable current gate driver 600 includes an inverter controller 630, a gate driver 650, and a variable current gate driver 620 that includes a slew rate controller 640.

The variable current gate driver 620 employs an embodiment of the variable current gate driver 10 described with reference to FIG. 1 to implement a variable, controllable gate turn-on slew rate and a variable, controllable gate turn-off slew rate at every switching event of the transistor 660 in a manner that optimizes system efficiency, reduces power losses, avoids switching speeds that may otherwise lead to electro-magnetic interference, reduces overvoltage events or undercurrent events, avoids change rates of voltage and/or current that may otherwise cause mechanical stresses in the electric machine, among other factors.

The inverter controller 630 receives information 605 that includes operating conditions, temperatures, voltages, etc., and determines commands for controlling the transistor 660, and generates a slew rate command 632 and a PWM command 634. The slew rate command 632 is input to the slew rate controller 640, which generates an OFF-to-ON slew rate command 653 and an ON-to-OFF slew rate command 654. The PWM command 634 is input to the gate driver 650, which generates an ON command 651 and an OFF command 652. The ON command 651, the OFF command 652, the OFF-to-ON slew rate command 653, and the ON-to-OFF slew rate command 654 are input to the variable current gate driver 620, which generates a control command 622 that is input to the gate of the transistor 660, to control operation. Voltage feedback 662 is monitored by the variable current gate driver 620.

The slew rate command 632 may be communicated to the slew rate controller 640 via a Serial Peripheral Interface (SPI) link, or directly, or via another communication link.

The variable current gate driver 620 may be implemented as an add-on ASIC, or integrated into another ASIC that includes the gate driver 650 to form a single chip implementation to reduce size, reduce cost, and improve manufacturability. The variable current gate driver 620 being implemented as an add-on ASIC permits circuit flexibility for ease of adoption into existing circuits.

Figure 7:
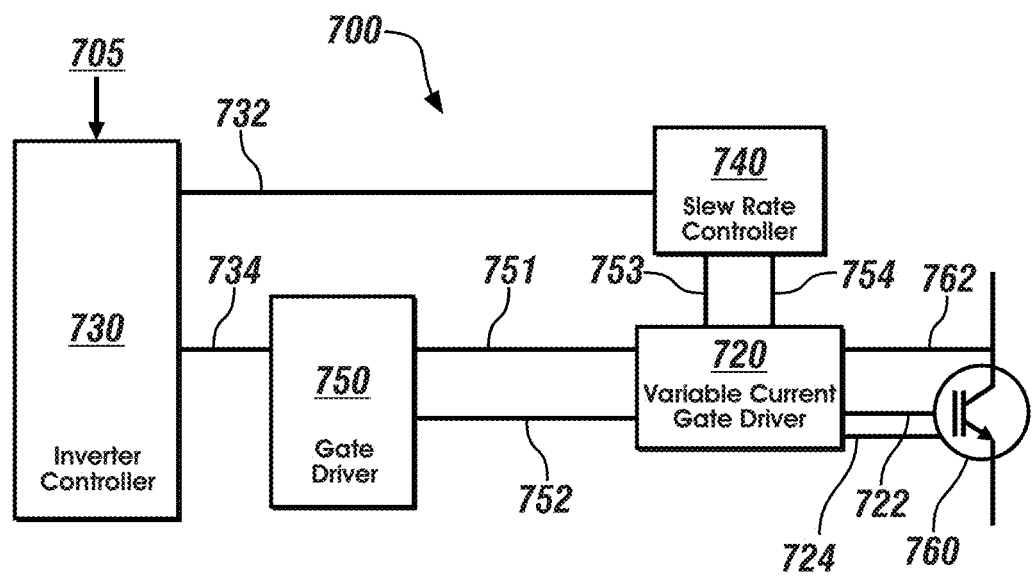
FIG. 7 schematically illustrates another embodiment of a variable current gate driver to control a transistor, in accordance with the disclosure.

FIG. 7 schematically illustrates an embodiment of a variable current gate driver 700 that incorporates an embodiment of a variable current gate driver 720 to control transistor 760, including controlling on and off slew rates of the transistor 760. In one embodiment, the transistor 760 is an element of an inverter for driving an electric machine, but the concepts described herein are not so limited.

The variable current gate driver 700 includes an inverter controller 730, a gate driver 750, and a variable current gate driver 720 that includes a slew rate controller 740.

The variable current gate driver 720 employs an embodiment of the variable current gate driver 10 described with reference to FIG. 1 to implement a variable, controllable gate turn-on slew rate and a variable, controllable gate turn-off slew rate at every switching event of the transistor 760 in a manner that optimizes system efficiency, reduces power losses, avoids switching speeds that may otherwise lead to electro-magnetic interference, avoids change rates of voltage and/or current that may otherwise cause mechanical stresses in the electric machine, among other factors.

The inverter controller 730 receives information 705 that includes operating conditions, temperatures, voltages, etc., and determines commands for controlling the transistor 760, and generates a slew rate command 732 and a PWM command 734. The slew rate command 732 is input to the slew rate controller 740, which generates an OFF-to-ON slew rate command 753 and an ON-to-OFF slew rate command 754. The PWM command 734 is input to the gate driver 750, which generates an ON command 751 and an OFF command 752. The ON command 751, the OFF command 752, the OFF-to-ON slew rate command 753, and the ON-to-OFF slew rate command 754 are input to the variable current gate driver 720, which generates a control command 722 that is input to the gate of the transistor 760, to control operation. In this embodiment, temperature 724 from the transistor 760 is monitored, and can be employed as part of the operation of the variable current gate driver 720. Voltage feedback 762 is monitored by the variable current gate driver 720.

The slew rate command 732 may be communicated to the slew rate controller 740 via a Serial Peripheral Interface (SPI) link, or directly, via analog or digital signals, or via another communication link.

The variable current gate driver 720 may be implemented as an add-on ASIC, or integrated into another ASIC that includes the gate driver 750 or integrated into another ASIC that includes the gate driver 750 to form a single chip implementation to reduce size, reduce cost, and improve manufacturability. The variable current gate driver 720 being implemented as an add-on ASIC permits circuit flexibility for ease of adoption into existing circuits.

Figure 8:
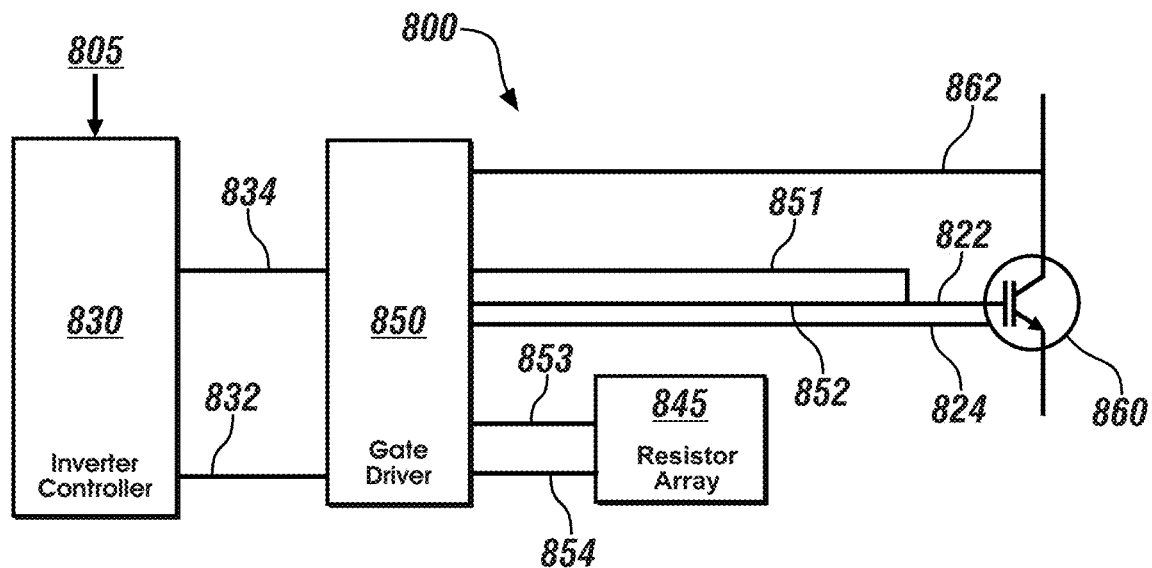
FIG. 8 schematically illustrates another embodiment of a variable current gate driver to control a transistor, in accordance with the disclosure.

FIG. 8 schematically illustrates an embodiment of a variable current gate driver 800 that incorporates an embodiment of a gate driver 850 to control transistor 860, including controlling on and off slew rates of the transistor 860. In one embodiment, the transistor 860 is an element of an inverter for driving an electric machine, but the concepts described herein are not so limited.

The variable current gate driver 800 includes an inverter controller 830 and gate driver 850. The gate driver 850 includes the gate driver, an embodiment of a variable current gate driver, and an embodiment of a slew rate controller into a single ASIC. The gate driver 850 communicates with the transistor 860 and a resistor array 845.

The variable current gate driver employs an embodiment of the variable current gate driver 10 described with reference to FIG. 1 to implement a variable, controllable gate turn-on slew rate and a variable, controllable gate turn-off slew rate at every switching event of the transistor 860 in a manner that optimizes system efficiency, reduces power losses, avoids switching speeds that may otherwise lead to electro-magnetic interference, avoids change rates of voltage and/or current that may otherwise cause mechanical stresses in the electric machine, among other factors.

The inverter controller 830 receives information 805 that includes operating conditions, temperatures, voltages, etc., and determines commands for controlling the transistor 860, and generates a slew rate command 832 and a PWM command 834, which are input to the gate driver 850. The slew rate command 832 is used to generates an OFF-to-ON slew rate command 853 and an ON-to-OFF slew rate command 854. The PWM command 834 is used to generate an ON command 851 and an OFF command 852. The ON command 851, the OFF command 852, the OFF-to-ON slew rate command 853, and the ON-to-OFF slew rate command 854 are input as a control command 822 that is input to the gate of the transistor 860, to control operation. In this embodiment, temperature 824 from the transistor 860 is monitored, and can be employed as part of the operation of the variable current gate driver. Voltage feedback 862 is also monitored.

The gate driver 850 may be implemented as an ASIC to form a single chip implementation to reduce size, reduce cost, and improve manufacturability.

Figure 9:
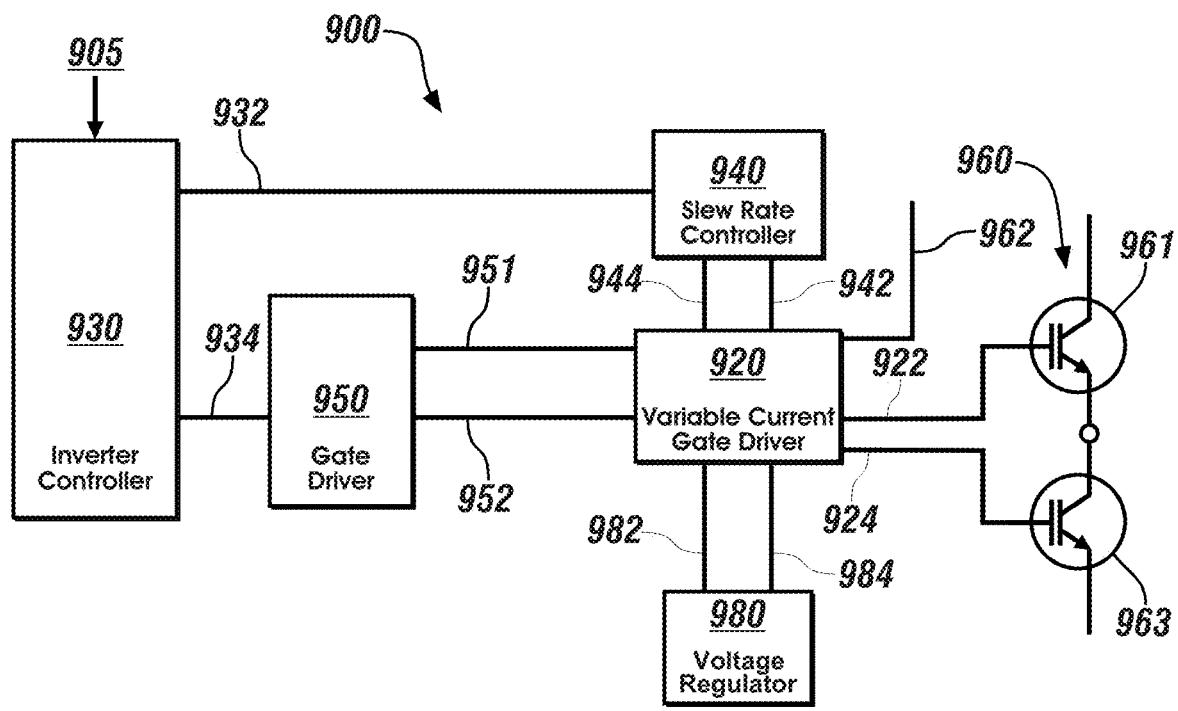
FIG. 9 schematically illustrates an embodiment of a variable current gate driver to control a hybrid switch, in accordance with the disclosure.

FIG. 9 schematically illustrates an embodiment of a variable current gate driver 900 that incorporates an embodiment of a variable current gate driver 920 to control a hybrid switch 960, including controlling on and off slew rates of the hybrid switch 960. In one embodiment, the hybrid switch 960 is composed as a first transistor 961 arranged in series with a second transistor 963, wherein the first transistor 961 is one type of transistor, e.g., an IGBT device, and the second transistor 963 is a second type of transistor, e.g., a FET, a MOSFET, or another type of transistor other than an IGBT device. In one embodiment, the hybrid switch 960 is an element of an inverter for driving an electric machine, but the concepts described herein are not so limited.

Alternatively, the hybrid switch 960 is composed with the first transistor 961 being arranged in parallel with the second transistor 963, wherein the first transistor 961 is one type of transistor, e.g., an IGBT device, and the second transistor 963 is a second type of transistor, e.g., a FET, a MOSFET, or another type of transistor other than an IGBT device.

The variable current gate driver 900 includes an inverter controller 930, a gate driver 950, and a variable current gate driver 920 that includes a slew rate controller 940 and a gate voltage regulator 980.

The variable current gate driver 920 employs an embodiment of the variable current gate driver 10 described with reference to FIG. 1 to implement a variable, controllable gate turn-on slew rate and a variable, controllable gate turn-off slew rate at every switching event of the hybrid switch 960 in a manner that optimizes system efficiency, reduces power losses, avoids switching speeds that may otherwise lead to electro-magnetic interference, avoids change rates of voltage and/or current that may otherwise cause mechanical stresses in the electric machine, among other factors.

The inverter controller 930 receives information 905 that includes operating conditions, temperatures, battery and device voltages, etc., and determines commands for controlling the hybrid switch 960, and generates a slew rate command 932 and a PWM command 934. The gate voltage regulator 980 generates a first gate voltage command 982 and a second gate voltage command 984. The slew rate command 932 is input to the slew rate controller 940, which generates an OFF-to-ON slew rate command 942 and an ON-to-OFF slew rate command 944. The PWM command 934 is input to the gate driver 950, which generates an ON command 951 and an OFF command 952.

The ON command 951, the OFF command 952, the OFF-to-ON slew rate command 942, the ON-to-OFF slew rate command 944, the first gate voltage command 982, and the second gate voltage command 984 are input to the variable current gate driver 920, which generates a first control command 922 that is input to the gate of the first transistor 961 of the hybrid switch 960, and a second control command 924 that is input to the gate of the second transistor 963 of the hybrid switch 960, to control operation. Voltage feedback 962 is monitored by the variable current gate driver 920. The variable current gate driver 920 may be implemented as an add-on ASIC, or integrated into another ASIC that includes the gate driver 950 to form a single chip implementation to reduce size, reduce cost, and improve manufacturability. The variable current gate driver 920 being implemented as an add-on ASIC permits circuit flexibility for ease of adoption into existing circuits.

In one embodiment, the variable current gate driver may employ a discrete quantity of slew rates. These discrete values can be tuned to provide an optimal balance of inverter efficiency and heat generation while maintaining operation of the inverter switches. These discrete values and points can be implemented in a lookup table, and coupled to specific ranges of operating conditions. The operating conditions are used to select a target slew rate or resistance for a set of operating conditions. The variable current gate driver is configured to detect a voltage or current overshoot, and respond by changing the slew rate through a control loop or an active feedback loop.

When using the variable current gate driver, there can be controller, software, and hardware delays that can affect the responsiveness of the gate slew rate selection.

The variable current gate driver can be tuned to select and dynamically adjust the slew rate based on system latencies, delays, response times, fault events, and other factors, implementing either or both a time-based margin and a current-based margin for the gate tuning.

The variable current gate driver may be advantageously employed to control an inverter or converter systems to minimize switching losses, i.e., hard switching or zero-voltage switching power electronics, for electric vehicle (EV) and non-EV applications.

The use of the variable current gate driver enables the use of multiple gate slew rates, providing faster and smoother on and off switching that may achieve lower power loss and/or electromagnetic interference, or EMI.

The variable current gate driver includes a slew rate control strategy, which includes monitoring inverter signals and operating conditions (e.g., voltage, current, speed, torque, load, temperature, etc.), and selecting a target slew rate that optimizes efficiency, performance, and device protection simultaneously. The slew rate control strategy may include slew rate selection and control strategies that optimize switching losses in the inverter, avoid specific switching speeds that can exacerbate electromagnetic interference issues, control rates of change of current and/or voltage to mitigate specific mechanical or thermal faults, and provide flexibility in updating the switching speed using OTA (over the air) communication, facilitate feed-forward or feedback variable current gate driver controls to control and output multiple slew rates. The concepts can be implemented as an add-on ASIC for existing design, or as a stand-alone ASIC. The stand-alone ASIC may include features such as on-die temperature and voltage signals to control variable current gate driver slew rate, on-die current sense/current mirror to drive variable current gate driver slew rate, and monitoring vehicle operating conditions such as speed, torque, vehicle modes, etc.) to update switching slew rates.

The multiple slew rate capability of the variable current gate driver enables it to be used for a hybrid inverter, i.e., a i.e., an inverter that uses a combination of IGBT and MOSFET switches, etc., to optimize the slow rate control for different transistors (BJT, IGBT, MOSFET, HEMT, and JFET, etc.) in terms of their corresponding semiconductor properties (Si, SiC, GaN, or AlN, etc.) and device physics.

The detailed description and the drawings or figures are supportive and descriptive of the present teachings, but the scope of the present teachings is defined solely by the claims. While some of the best modes and other embodiments for carrying out the present teachings have been described in detail, various alternative designs and embodiments exist for practicing the present teachings defined in the claims.

What is claimed is:

1. A variable current gate driver for a transistor, comprising:
    a first current control device that is connected in series with a second current control device at a junction, wherein the junction is electrically connected to an activator of the transistor;
    the first current control device including a first bi-polar junction transistor (BJT), a first variable resistor and a first switch control circuit arranged between a first power input and a second power input;
    the second current control device including a second bi-polar junction transistor (BJT), a second variable resistor and a second switch control circuit arranged between the first power input and the second power input;
    the first BJT being arranged in series with the second BJT;
    the first switch control circuit being arranged in series with the first variable resistor that is connected to a gate of the first BJT;
    the second switch control circuit being arranged in series with the second variable resistor that is connected to a gate of the second BJT;
    the first current control device having a first controllable output current;
    the second current control device having a second controllable output current;
    a controller, the controller being operatively connected to the first and second current control devices to control the first and second controllable output currents, including the controller being operatively connected to the first variable resistor and the first switch control circuit to control the first BJT to control the first controllable output current from the first current control device, and the controller being operatively connected to the second variable resistor and the second switch control circuit to control the second BJT to control the second controllable output current from the second current control device; and
    the controller operative to control the first and second current control devices to control activation of the transistor via the activator.

2. The variable current gate driver of claim 1, wherein the controller operative to control the first and second current control devices to control activation of the transistor via the activator further comprises the controller being operative to control the first and second current control devices to control a slew rate of the transistor.

3. The variable current gate driver of claim 2, wherein the controller operative to control the first and second current control devices to control the slew rate of the transistor comprises the controller being operative to:
    control the first and second current control devices to control the slew rate of the transistor to a first slew rate during operation in a first state; and
    control the first and second current control devices to control the slew rate of the transistor to a second slew rate during operation in a second state.

4. The variable current gate driver of claim 3, wherein the first slew rate is greater than the second slew rate.

5. The variable current gate driver of claim 3, wherein the first slew rate is less than the second slew rate.

6. The variable current gate driver of claim 3, wherein the first slew rate is equivalent to the second slew rate.

7. The variable current gate driver of claim 2, wherein the controller is operative to control the first and second current control devices to control an OFF-to-ON slew rate of the transistor.

8. The variable current gate driver of claim 2, wherein the controller is operative to control the first and second current control devices to control an ON-to-OFF slew rate of the transistor.

9. The variable current gate driver of claim 1, wherein the first current control device comprises a variable current source, and wherein the second current control device comprises a variable current source.

10. The variable current gate driver of claim 1, wherein the first current control device comprises a first modified voltage source having a controllable output current, and wherein the second current control device comprises a second modified voltage source having a controllable output current.

11. The variable current gate driver of claim 1, wherein the transistor comprises one of a bipolar junction transistor (BJT), a thyristor, a high electron mobility transistor (HEMT), a field-effect transistor (FET), a metal oxide semiconductor field effect transistor (MOSFET), an integrated gate bipolar transistor (IGBT), or a gallium-nitride (GaN) transistor.

12. The variable current gate driver of claim 1, wherein the first power input has a positive voltage and the second power input has a negative voltage.

13. The variable current gate driver of claim 1, wherein the first power input has a positive voltage and the second power input has a reference voltage.

14. The variable current gate driver of claim 13, wherein the reference voltage comprises a ground.

15. The variable current gate driver of claim 1, wherein the first power input has a reference voltage and the second power input has a negative voltage.

16. The variable current gate driver of claim 1, wherein the controller is operative to control the first current control device independently from the second current control device to control activation of the transistor via the activator.

17. An inverter system, comprising:
a plurality of power switches arranged between a positive bus and a negative bus, wherein each of the plurality of power switches includes an activator;
a variable current gate driver including a plurality of current-controlled gate drivers operatively coupled to the activators of the plurality of power switches;
wherein each of the plurality of current-controlled gate drivers includes
a first current control device connected in series with a second current control device at a junction, wherein the junction is electrically connected to an activator of one of the plurality of power switches;
wherein the first current control device includes a first bi-polar junction transistor (BJT), a first variable resistor and a first switch control circuit arranged between a first power input and a second power input,
wherein the second current control device includes a second bi-polar junction transistor (BJT), a second variable resistor and a second switch control circuit arranged between the first power input and the second power input,
wherein the first BJT arranged in series with the second BJT,
wherein the first switch control circuit is arranged in series with the first variable resistor that is connected to a gate of the first BJT,
wherein the second switch control circuit is arranged in series with the second variable resistor that is connected to a gate of the second BJT,
wherein the first current control device has a first controllable output current, and wherein the second current control device has a second controllable output current;
a controller, the controller being operatively connected to the first and second current control devices of the plurality of power switches to control the first and second controllable output currents, including the controller being operatively connected to the first variable resistor and the first switch control circuit to control the first BJT to control the first controllable output current from the first current control device, and the controller being operatively connected to the second variable resistor and the second switch control circuit to control the second BJT to control the second controllable output current from the second current control device; and
wherein the controller is operative to control the first current control device and second current control device of each of the plurality of current-controlled gate drives to activate the plurality of power switches via the plurality of current-controlled gate drivers.

18. The inverter system of claim 17, wherein the controller operative to control the first and second variable current sources to activate the plurality of power switches via the plurality of gate drivers further comprises the controller being operative to control the first and second variable current sources current control devices of each of the plurality of current-controlled gate drives to control slew rates of the plurality of power switches.

19. The inverter system of claim 18, wherein the controller operative to control the first and second current control devices of each of the plurality of current-controlled gate drives to control the slew rates of the plurality of power switches comprises the controller being operative to:
control the first and second variable current sources to control the plurality of power switches to a first slew rate when transitioning the plurality of power switches from a first state to a second state; and
control the first and second variable current sources to control the plurality of power switches to a second slew rate during operation in the second state;
wherein the first slew rate is greater than the second slew rate.

* * * * *